United States Patent
Merritt et al.

(10) Patent No.: US 6,735,729 B1
(45) Date of Patent: May 11, 2004

(54) COMPRESSION CIRCUIT FOR TESTING A MEMORY DEVICE

(75) Inventors: Todd A. Merritt, Boise, ID (US); Nicholas VanHeel, Eagle, ID (US)

(73) Assignee: Micron Technology, Inc, Boise, ID (US)

( * ) Notice: Subject to any disclaimer, the term of this patent is extended or adjusted under 35 U.S.C. 154(b) by 0 days.

(21) Appl. No.: 09/376,786

(22) Filed: Aug. 18, 1999

(Under 37 CFR 1.47)

(51) Int. Cl.[7] .............................. G11C 29/00; G11C 7/00
(52) U.S. Cl. ........................................ 714/718; 365/201
(58) Field of Search ........................ 714/718; 365/200, 365/201

(56) References Cited

U.S. PATENT DOCUMENTS

| | | | | |
|---|---|---|---|---|
| 4,628,509 A | * | 12/1986 | Kawaguchi | 714/711 |
| 5,173,906 A | * | 12/1992 | Dreibelbis et al. | 714/733 |
| 5,313,424 A | * | 5/1994 | Adams et al. | 365/201 |
| 5,442,641 A | * | 8/1995 | Beranger et al. | 714/719 |
| 5,475,692 A | * | 12/1995 | Hatano et al. | 714/719 |
| 5,511,029 A | * | 4/1996 | Sawada et al. | 365/201 |
| 5,535,164 A | * | 7/1996 | Adams et al. | 365/201 |
| 5,557,619 A | * | 9/1996 | Rapoport | 714/733 |
| 5,644,578 A | * | 7/1997 | Ohsawa | 714/719 |
| 5,787,097 A | * | 7/1998 | Roohparvar et al. | 714/722 |
| 5,838,627 A | * | 11/1998 | Tomishima et al. | 365/230.03 |
| 5,859,804 A | * | 1/1999 | Hedberg et al. | 365/201 |
| 5,946,245 A | * | 8/1999 | Brown et al. | 365/201 |
| 5,954,830 A | * | 9/1999 | Ternullo, Jr. | 714/718 |
| 6,016,561 A | * | 1/2000 | Roohparvar et al. | 714/720 |
| 6,026,505 A | * | 2/2000 | Hedberg et al. | 714/711 |
| 6,058,056 A | * | 5/2000 | Beffa et al. | 365/201 |
| 6,295,618 B1 | * | 9/2001 | Keeth | 714/718 |
| 6,314,538 B1 | * | 11/2001 | Ochoa et al. | 714/724 |

* cited by examiner

*Primary Examiner*—Christine T. Tu
*Assistant Examiner*—Joseph D. Torres
(74) *Attorney, Agent, or Firm*—Williams, Morgan & Amerson, P.C.

(57) ABSTRACT

An apparatus for testing a memory device having a plurality of data lines includes an input circuit, a compression circuit, and an output circuit. The input circuit is adapted to receive at least a first subset of the data lines and a plurality of enable signals. Each enable signal is associated with at least one of the first subset of data lines. The compression circuit is coupled to the input circuit and is adapted to detect a predetermined pattern on the first subset of data lines. The output circuit is coupled to the compression circuit and adapted to provide at least a pass signal when the predetermined pattern is detected on the first subset of data lines. The input circuit is capable of masking at least one of the first subset of data lines from the compression circuit based on the associated enable signal.

24 Claims, 8 Drawing Sheets

COMPRESSION CIRCUIT FOR TESTING A MEMORY DEVICE

BACKGROUND OF THE INVENTION

1. Field of the Invention

This invention relates generally to the testing of memory devices, and more particularly to the testing of memory devices using a compression circuit.

2. Description of the Related Art

Memory devices, such as a synchronous dynamic random access memory (SDRAM), are being developed with ever-increasing densities. During the manufacturing process, the memory device is tested to verify proper operation. If improperly functioning cells are identified, the memory device may be repaired or discarded, depending on the number, type, and arrangement of faulty memory cells. Also, if a sample of memory devices is tested and the individual memory devices are found to have faults in common locations, certain stages in the manufacturing process may be examined and/or altered to correct possible systemic defects.

As the density of memory devices increases, the time required to test the devices also increases. Compression circuits have been developed to simultaneously test blocks of memory cells and provide information regarding the success or failure of the test. A test using a compression circuit indicates that one of the cells in the block of cells is faulty. Further testing is required to identify the specific cell. Typically, the further test involves a time consuming cell-by-cell test to identify the faulty cell.

FIG. 1 illustrates a logic diagram of a prior art compression circuit 10. The compression circuit 10 of FIG. 1 receives sixteen input lines, D1–D16 (e.g., I/O lines) and provides an output based on the success of the test. The compression circuit 10 includes a first portion 14 adapted to provide an indication that all logic ones are present on the input lines D1–D16, and a second portion 16 adapted to provide an indication that all logic zeros are present on the input lines D1–D16. If any of the input lines D1–D16 on the first portion 14 receive a logic "0", the first portion 14 of the compression circuit 10 will indicate a fail condition. Likewise, if any of the input lines on the second portion 16 receives a logic "1", the second portion 14 of the compression circuit 10 will indicate a fail condition.

The first portion 14 of the compression circuit 10 includes an arrangement of NAND gates 18, NOR gates 20, and an inverter 22 that collectively perform a logical 16-bit wide NAND function. Conversely, the second portion 16 of the compression circuit 10 includes NOR gates 24, NAND gates 26, and an inverter 28 that collectively perform a logical 16-bit wide NOR function. The compression ratio of the compression circuit 10 may be altered by increasing or decreasing the number of cascaded rows of NAND gates 18, 24 and NOR gates 20, 26.

The compression circuit 10 also includes an output circuit 30 adapted to tailor the output format into one of two output modes, tristate and JEDEC. The JEDEC mode of operation corresponds to a mode of error detection defined by Joint Electron Device Engineering Council (JEDEC) standards. The output circuit 30 includes multiplexers 32, 33 that are enabled during the tristate mode of operation, and multiplexers 34, 35 that are enabled during the JEDEC mode of operation. Mutually exclusive logic signals, TRI and JED on lines 36, 37, respectively, determine the particular multiplexers 32, 33, 34, 35 that are enabled.

To operate in the tristate output mode, the TRI signal is held at a logically high state to enable the multiplexers 32, 33. The JED signal is held at a logically low state to disable the multiplexers 34, 35. The multiplexer 32 receives the output of the first portion 14 of the compression circuit 10, where the first portion 14 outputs a logic "0" to indicate a pass condition and a logic "1" to indicate a fail condition. The output of the multiplexer 32 is coupled to the gate input of a p-type transistor 38. The transistor 38 is connected between a voltage source 39 (e.g., about 2.2V) and an output terminal 40. When the first portion 14 of the compression circuit 10 indicates a pass condition (i.e., logic "0"), the transistor 38 is enabled and the voltage at the output terminal 40 is pulled to a logically high state by the voltage source 39. During a fail condition (i.e., logic "1") the transistor 38 is disabled, disconnecting the power source 39 from the output terminal 40.

The multiplexer 33 receives the output of the second portion 16 of the compression circuit 10, where the second portion 16 outputs a logic "1" to indicate a pass condition and a logic "0" to indicate a fail condition. The output of the multiplexer 33 is coupled to the gate input of an n-type transistor 42. The transistor 42 is connected between the output terminal 40 and ground. When the second portion 16 of the compression circuit 10 indicates a pass condition (i.e., logic "1"), the transistor 42 is enabled and the voltage at the output terminal 40 is pulled to a logically low state. During a fail condition (i.e., logic "0") the transistor 42 is disabled, disconnecting the output terminal 40 from ground.

The portion 14, 16 of the compression circuit 10 that indicates a passing condition will control the voltage on the output terminal 40. The voltage on the output terminal 40 is read to determine the success or failure of the test. The value on the output terminal 40 of the compression circuit 10 matches the actual value that was written to the cells during the test. For example, if all logic "1" values were successfully read from the memory device, the first portion 14 would pass and the second portion 16 would fail. The compression circuit 10 would output a logic "1" to indicate the successful test. Conversely, if all logic "0" values were successfully read from the memory device, the second portion 16 would pass and the first portion 14 would fail. The compression circuit 10 would output a logic "0" to indicate the successful test. If both portions 14, 16 indicate a fail condition, the output terminal 40 is tristated and has a voltage of about 1.1V.

To operate in the JEDEC output mode, the JED signal is held at a logically high state to enable the multiplexers 34, 35, and the TRI signal is held at a logically low state to disable the multiplexers 32, 33. The outputs of the first and second portions 14, 16 of the compression circuit 10 are received by an XOR gate 44. In the circuit of FIG. 1, the XOR gate 44 is a two input gate, however, the actual transistors (not shown) that define the XOR gate 44 require the both the input signal and its compliment to operate. Accordingly, the output of the inverter 22, its compliment (i.e., the input to the inverter 22), the input of the inverter 28, and its compliment (i.e., the output of the inverter 28) are provided to the XOR gate 44. Unlike the example described above for the tristate mode, the input of the inverter 28 indicates pass or fail as opposed to the output of the inverter 28. Accordingly, a pass condition is denoted by a logic "0" at the input of the inverter 28.

The output of the XOR gate 44 is inverted by an inverter 46. The output of the inverter 46 is provided to the multiplexers 34, 35. If only one of the first and second portions 14, 16 of the compression circuit 10 indicates a pass condition (i.e., one portion 14, 16 has a logic "0" and the other has a logic "1"), the XOR gate 44 outputs a logic "1", which is inverted by the inverter 46. The resulting logic "0" is provided to the multiplexers 34, 35, thus enabling the transistor 38 and pulling the voltage at the output terminal 40 to a logically high state. Conversely, if both the first and second portion 14, 16 pass or both fail, the XOR gate 44 outputs a logic "0", which is inverted by the inverter 46. The resulting logic "1" is provided to the multiplexers 34, 35, thus enabling the transistor 42 and pulling the voltage at the output terminal 40 to ground.

FIG. 2 is a timing diagram of the response of the compression circuit 10 to various passed and failed tests. In the tristate mode of operation, the TRI signal 50 is held at a logically high state. The JED signal (not shown) is held at a logically low state. A failure signal 52 is used to simulate a test failure. During alternating tests, the compression circuit output signal 54 alternates between a logic "1" level and a logic "0" level to indicate the successful logic "1" tests and logic "0" tests. During a simulated failure 56, both the first portion 14 and the second portion 16 indicate a failed condition and the compression circuit output signal 54 is tristated.

In the JED mode (JEDEC), the ACT signal 50 is held at a logically low state. The JED signal (not shown) is held at a logically high state. During alternating tests the compression circuit output signal 54 maintains a logic "1" level to indicate the successful logic "1" tests and logic "0" tests. During a simulated failure 58, both the first portion 14 and the second portion 16 indicate a failed condition on successive tests and the compression circuit output signal 54 transitions to a logic "0" state to indicate the failure.

Compression circuits are typically included on the die of the memory device along with the memory device core. In embedded devices with multiple memory cores, each core typically has its own compression circuitry. The compression circuit typically receives inputs from a plurality of local or intermediate input/output (I/O) lines and provides an output indicating that either all lines passed or one of the lines failed. One or more compression circuits may be used, depending on the degree of desired compression. For example, if it was desired to simultaneously test 64 lines, and each compression circuit was adapted to receive eight input lines, eight compression circuits would be required.

The outputs of the compression circuit are typically tied to the external data in/data out (DQ) lines of the memory device. Changes in the memory device density and/or architecture of the memory device often require that the routing and logic gate arrangement of the compression circuit be redesigned.

During the testing process, the compression circuit adds a finite amount of delay to the stage of the memory device including the compression circuit. In a three cycle latency memory device, the compression circuit is typically included in the third stage, prior to the DQ outputs. Consider the case where, without the compression circuit enabled, the time required to complete the third stage is equal to or less than the time to complete the other two stages. The overall speed of the memory device is determined by the longest stage (i.e., the clock used to drive the memory device cannot have a period shorter than the length of the slowest stage). Now, add the additional delay contributed by the compression circuit (i.e., logic gate propagation times) to the third stage. With the additional delay, the third stage may become the speed limiting stage, and as a result, the speed of the memory device may need to be downgraded because the memory device cannot be tested at full speed. Reducing the clock frequency of the input clock used to test the memory device also lengthens the amount of time required to test the memory device.

As is common in memory device design, the memory device may have lines with differing data topologies. For example, if a logic "1" is written into a cell of a first topology type, a logic "1" is stored in the cell. If the same logic "1" is written into a cell of a second topology, a logic "0" may actually be stored in the cell. During the testing of the memory device, lines of one topology type may not be compressed with lines of a second topology type.

One of the lines coupling the memory device to the compression circuit may be shorted to another of the lines. If all the lines of the same topology type were to run in parallel from the memory device to the compression circuit, it is possible that the compression circuit might illegally pass the test (i.e., fail to detect the fault). Another possible error might arise due to capacitive coupling between adjacent lines. For example, if sixteen adjacent lines are coupled to one compression circuit, capacitive coupling could occur between the lines. A failed line may be coupled by the other fifteen lines, which are going to a logically high state, and forced to a logically high state. Coupling of this nature could disguise faults in the memory device.

The present invention is directed to overcoming, or at least reducing the effects of, one or more of the problems set forth above.

SUMMARY OF THE INVENTION

In one aspect of the present invention, an apparatus is provided for testing a memory device having a plurality of data lines. The apparatus includes an input circuit, a compression circuit, and an output circuit. The input circuit is adapted to receive at least a first subset of the data lines and a plurality of enable signals. Each enable signal is associated with at least one of the first subset of data lines. The compression circuit is coupled to the input circuit and is adapted to detect a predetermined pattern on the first subset of data lines. The output circuit is coupled to the compression circuit and adapted to provide at least a pass signal when the predetermined pattern is detected on the first subset of data lines. The input circuit is capable of masking at least one of the first subset of data lines from the compression circuit based on the associated enable signal.

In another aspect of the present invention, a method is provided for testing a memory device having a plurality of data lines. The method includes reading data present on at least a subset of the plurality of data lines. The data associated with at least one data line of the subset is masked. It is determined if the data matches a predetermined pattern. At least a pass signal is provided if the data matches the predetermined pattern.

BRIEF DESCRIPTION OF THE DRAWINGS

The invention may be best understood by reference to the following description taken in conjunction with the accompanying drawings, in which like reference numerals identify like elements, and in which.

Figure 1:
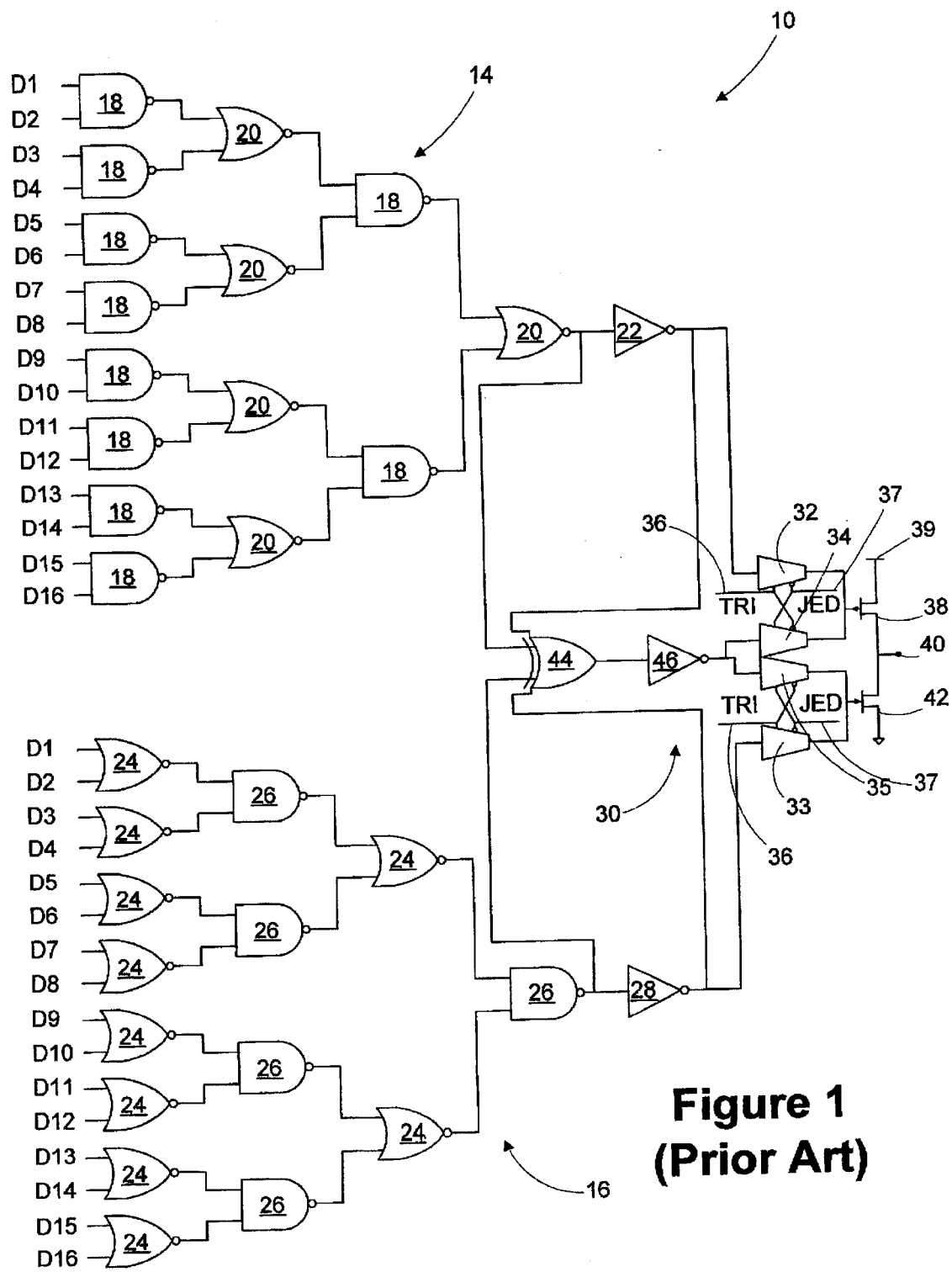
FIG. 1 is a logic diagram of a prior art compression circuit used to test a memory device.
Figure 2:
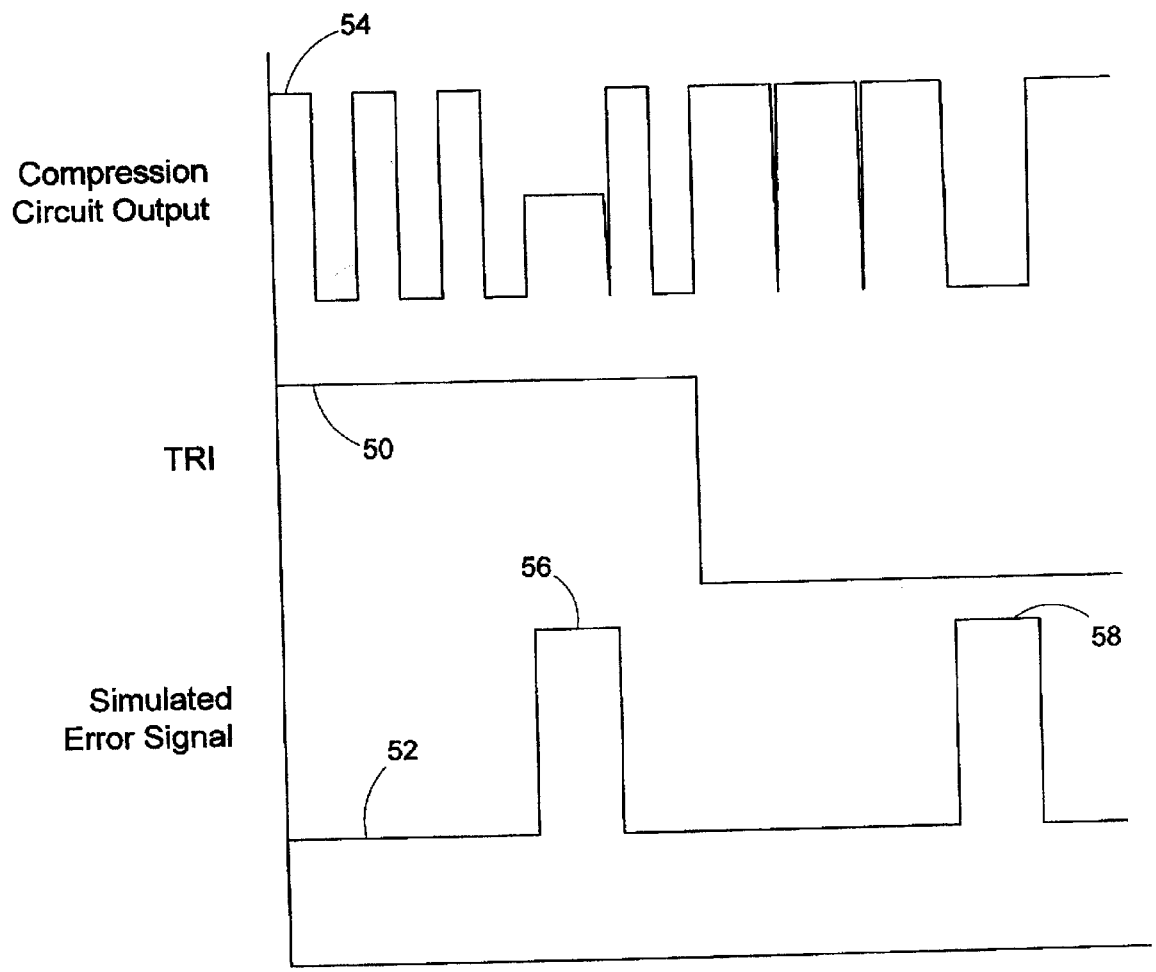
FIG. 2 is a timing diagram illustrating the operation of the prior art compression circuit of FIG. 1.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 3:
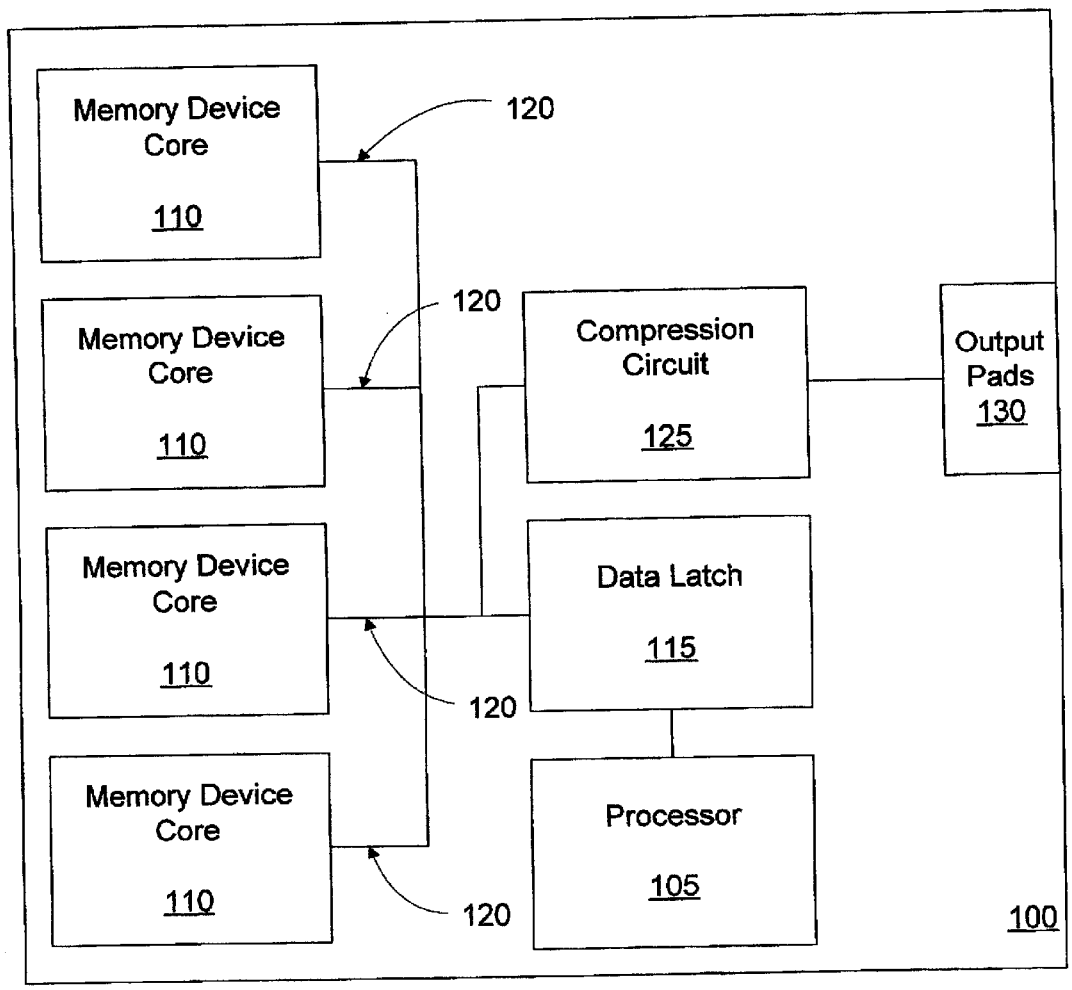
FIG. 3 is a block diagram of an embedded device in accordance with the present invention.

Referring to FIG. 3, a block diagram of an embedded device 100 is provided. For clarity and ease of understanding, only the elements of the embedded device 100 useful to illustrate the present invention are described. The embedded device 100 includes a processor 105 and four memory device cores 110. A data latch 115 is coupled to the processor 105 and the memory device cores 110 for holding data read from the memory device cores 110. The memory device cores 110 each have data input/output lines (DQ lines) 120 that are connected in parallel to the data latch 115. The processor 105 may only access one of the memory device cores 110 at any given time. Accordingly, the DQ lines 120 of the other non-enabled memory device cores 110 will be in a tristate condition, allowing the enabled memory device core 110 to drive its DQ lines 120 to the data latch 115. The DQ lines 120 of the memory device cores 110 are also coupled to a compression circuit 125. The compression circuit 125 is coupled to output pads 130 that may be accessed externally.

Although the compression circuit 125 is described in the context of an embedded device 100 including a plurality of memory device cores 110, its application is not so limited. It is contemplated that the concepts described herein may be applied to other applications, such as stand-alone commodity memory devices (not shown).

The compression circuit 125 receives and compresses a plurality of the DQ lines 120 and provides an output indicating whether the data present on the DQ lines 120 that was read from one of the memory device cores 110 matches the pattern that was written into that memory device core 110. Unlike the compression circuit 10 of FIG. 1, the compression circuit 125 compresses data on the DQ lines 120 leaving the memory device cores 110, as opposed to the I/O lines (not shown) within the memory device cores 110. This allows the compression circuit 125 to be shared by the memory device cores 110, thus permitting each of the memory device cores 110 to be tested without duplicating compression logic. Also, because the compression circuit 125 is separate from the memory device cores 110, changes in the design or density of the memory device cores 110 do not require re-design or modification of the compression circuit 125.

In the illustrated embodiment, each memory device core 110 has 64 DQ lines 120 and four output pads 130. Accordingly, the compression circuit 125 is adapted to perform a 16 to 1 compression to populate the output pads 130. Other compression ratios are contemplated depending on factors such as the number of DQ lines 120 exiting each memory device core 110 and the number of output pads 130 available on the embedded device 100.

Figure 4:
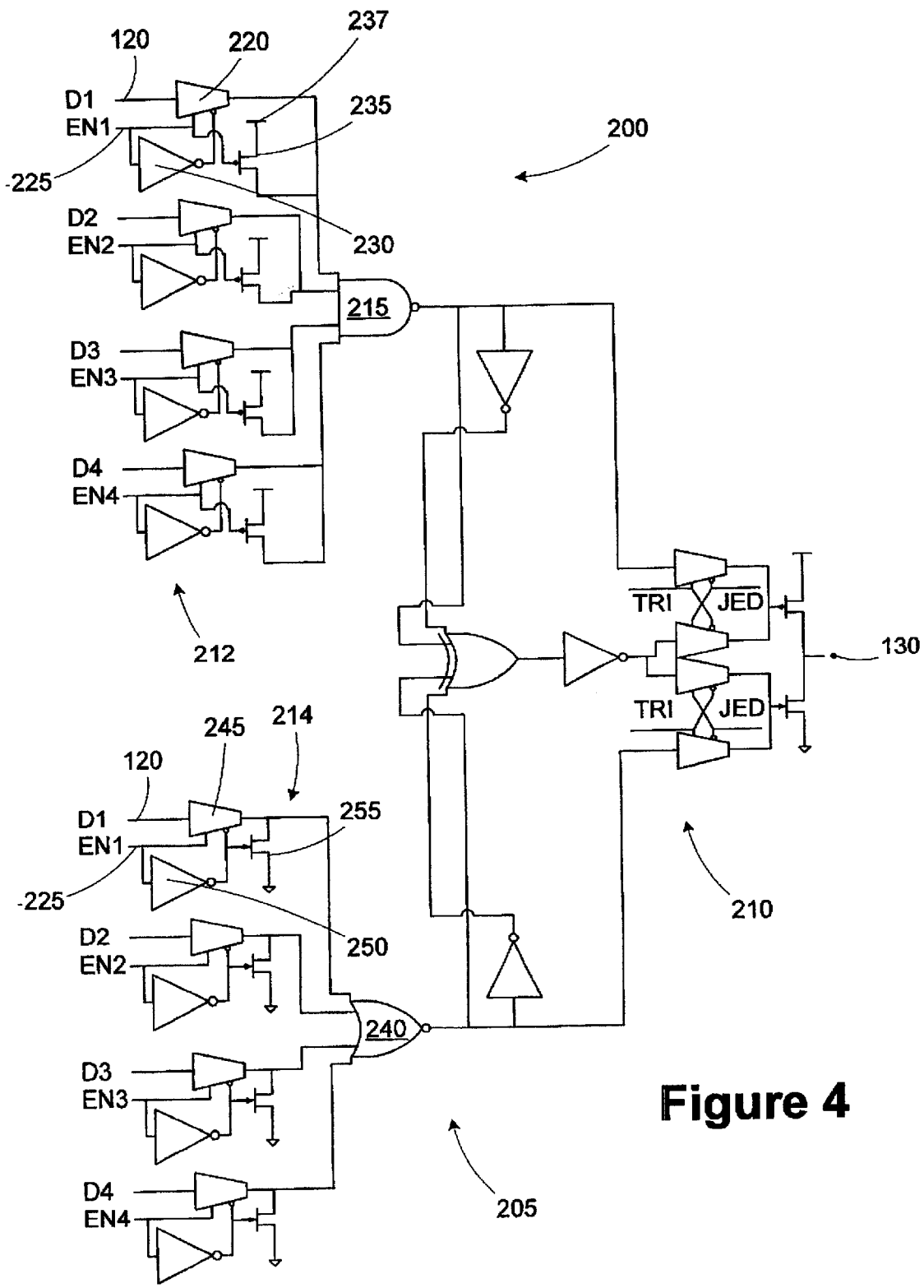
FIG. 4 is a logic diagram of a compression circuit in accordance with the present invention.

FIG. 4 illustrates a circuit diagram of one embodiment of the compression circuit 125 in accordance with the present invention. For ease of illustration, the compression circuit 125 of FIG. 4 accomplishes a 4 to 1 compression. In light of this disclosure, the compression circuit 125 can be readily scaled to provide any desired compression ratio. Also, the embedded device 100 may include multiple compression circuits 125 depending on the desired compression ratio and the number of output pads 130.

To test one of the memory device cores 110, a pattern of logic values are written into a group of cells in the memory device core 110. The same group of cells is then read to verify that the data was stored properly. Typically, all logic ones or logic zeros are written to the device. If the memory device core 110 is functioning properly, the pattern of ones or zeros will be recreated on the DQ lines 120. The compression circuit 125 includes a first portion 200 adapted to detect the situation where all ones are present on the DQ lines 120 and a second portion 205 adapted to detect where all zeroes are present on the DQ lines 120. An output circuit 210 receives the signals from the first portion 200 and the second portion 205 and provides an output to the output pad 130 indicating the success or failure of the test. The output circuit 210 operates in one of the tristate and JEDEC modes, as described above in reference to FIG. 1. The compression circuit 125 also includes input circuits 212, 214 adapted to selectively mask out individual DQ lines 120.

The specific logic gates illustrated in FIG. 4 are provided for illustrative purposes. Other logic combinations that perform the same or similar logical operations are contemplated. It is also contemplated that the compression circuit 125 may be configured to test patterns other than all ones or all zeroes, depending on the specific implementation.

The input circuit 212 associated with the first portion 200 of the compression circuit 125 includes a NAND gate 215 that performs the compression function. Each input (Dx) from the DQ lines 120 is received by a multiplexer 220. Enable signals (ENx) on enable lines 225 are coupled to control inputs of the multiplexers 220. The enable signal is also provided to an inverter 230, which is in turn coupled to another control input for the multiplexer 220. When an enable signal ENx is asserted (i.e., at a logically high state) for a particular multiplexer 220, its corresponding data signal Dx is passed to the NAND gate 215.

The enable signal ENx is coupled to a p-channel transistor 235. When the enable signal ENx is not asserted, the transistor 235 is enabled, thus tying the input to the NAND gate 215 from the multiplexer 220 to a voltage source 237. Tying the input to the NAND gate 215 to a high logic level in this manner effectively masks the Dx input from the DQ lines 120 for which the corresponding enable signals ENx are not asserted.

The input circuit 214 associated with the second portion 205 of the compression circuit 125 includes a NOR gate 240 that performs the compression function. Each input (Dx) from the DQ lines 120 is received by a multiplexer 245. Enable signals (ENx) on the enable lines 225 are coupled to control inputs of the multiplexers 245. The enable signal ENx is also provided to an inverter 250, which is in turn coupled to another control input for the multiplexer 245. When an enable signal ENx is asserted (i.e., at a logically high state) for a particular multiplexer 245, its corresponding data signal Dx is passed to the NOR gate 240.

The output of the inverter 250 is coupled to an n-channel transistor 255. When the enable signal ENx is not asserted, the transistor 255 is enabled, thus pulling the input to the NOR gate 240 from the multiplexer 245 toward ground to a logically low level. Grounding the input to the NOR gate 240 in this manner effectively masks the Dx input from the DQ lines 120 for which the corresponding enable signal ENx is not asserted.

Masking selective DQ lines 120 has several advantages. First, by masking selected DQ lines 120, smaller subsets of the DQ lines 120 can be compressed and tested to determine the specific location of a faulted cell (not shown) within one of the memory device cores 110. This allows a faulted bit (not shown) to be located without a time consuming bit-by-bit check.

Another advantage to masking selective DQ lines 120 involves setting the compression ratio of the compression circuit 125. For example, the compression circuit 125 could receive 16 DQ lines 120 (i.e., compression ratio of 16 to 1). Certain DQ lines 120 could be masked to reduce the compression ratio of the compression circuit 125 to, for example 8 to 1 or 4 to 1.

During the manufacturing process, bulk samples of the embedded devices 100 are tested without compression to identify those embedded devices 100 having faulted cells (not shown). The same sample is then tested using a high compression ratio (e.g., 16 to 1). If the compression test is not successful in identifying the failed parts with sufficient accuracy, the test is repeated using a lower compression ratio (e.g., 8 to 1). This iterative process is repeated until an acceptably accurate compression ratio is determined. This ratio may then be used with confidence for subsequent production runs of the embedded devices 100. In light of this disclosure, the selective masking technique described above may be scaled to any desired compression ratio, depending on the specific size and nature of the embedded device 100 and its associated memory device cores 110.

It is contemplated that the input circuit 212, 214 may be modified to allow a single enable line 225 to mask a plurality of the DQ lines 120, depending on the specific implementation and the desired level of control.

Figure 5A:
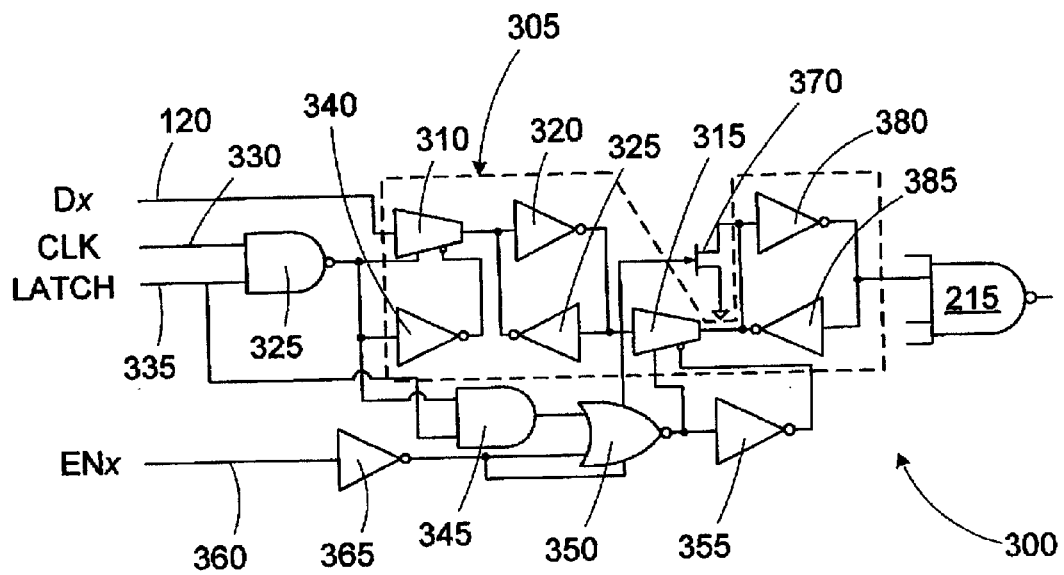
FIG. 5 is a logic diagram of an alternative embodiment of an input circuit of the compression circuit of FIG. 4.
Figure 5B:
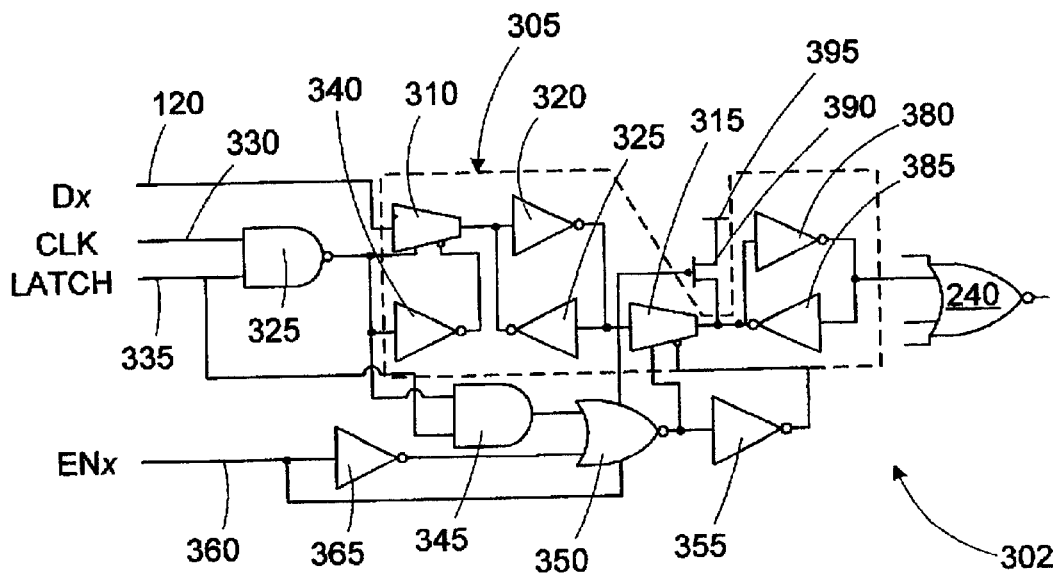

Alternative embodiments of input circuits 300, 302 for the first and second portions 200, 205 of the compression circuit 125 are illustrated in FIGS. 5A and 5B, respectively. Referring to FIG. 5A, the input circuit 300 includes a latch 305. The latch 305 allows the data on the DQ line 120 be latched prior to being compressed. Because the data on the DQ line 120 is latched prior to compression, the delay caused by the compression circuit 125 does not deleteriously affect the speed of the memory device core 110 being tested. The memory device core 110 may be tested under normal speed conditions.

For example, consider the case where the memory device core 110 has a latency of three cycles. If the compression circuit 125 were integrated into the memory device core 110, the resulting delay would lengthen the time required to complete the third stage (i.e., the stage containing the DQ lines 120). If the length of the third stage would be greater than the length of the other two stages, the speed of the memory device core 110 would be limited by the length of the third stage. In effect, to complete the testing of the memory device core 110, the speed of the memory device cores 110 would have to be reduced to accommodate the delay caused by the compression circuit 125.

Latching the DQ lines 120 before compression prevents the compression circuit 125 from becoming a speed limiting contributor. During testing, the memory device core 110 could be operated at a latency of four cycles. The memory device core 110 could still be tested at the maximum speed allowable by the normal propagation times of the other three stages.

Returning to FIG. 5A, the latch 305 includes a first multiplexer 310, a second multiplexer 315, and cross-coupled inverters 320, 325. The operation of the latch 305 is controlled by a NAND gate 325, which receives a clock signal (CLK) on a clock line 330 and a latch signal (LATCH) on a latch line 335. If the LATCH signal is deasserted (i.e., logic "0"), the latch 305 is disabled, and the data on the DQ line 120 flows through the latch 305 without being captured (i.e., as if the latch 305 were not present). It is contemplated that the input circuit 300 may be implemented without the flow through feature.

The first multiplexer 310 is controlled by the output of the NAND gate 325, which is coupled to the high control input of the first multiplexer 310. An inverter 340 receives an input from the NAND gate 325 and is coupled to the low control input of the first multiplexer 310. Accordingly, the first multiplexer 310 is enabled when the output of the NAND gate 325 is at a logically high state.

The second multiplexer 315 is controlled by an AND gate 345 coupled to a NOR gate 350 as shown. The output of the NOR gate 350 is coupled the high control input of the multiplexer 315, and to an inverter 355. The inverter 355 is in turn coupled to the low control input of the second multiplexer 315. Accordingly, the second multiplexer 315 is enabled when the output of the NOR gate 350 is at a logically high state.

The input circuit 300 also receives an enable signal (ENx) on an enable line 360 for disabling the DQ line 120 in the compression circuit 125. If the enable signal is deasserted (i.e., logic "0"), the value on the DQ line 120 is masked. The enable line 360 is coupled to an inverter 365. The inverter 365 is coupled to the NOR gate 350. If the enable signal is deasserted, the output of the NOR gate 350 will be forced to a logically low state, thus disabling the second multiplexer 315. The inverter 360 is also coupled to the gate input of an n-channel transistor 370. The transistor 370 is coupled between the output of the second multiplexer 315 and ground. If the enable signal is deasserted, the transistor 370 is enabled, and the output of the second multiplexer 315 is held at a logically low state. The second multiplexer 315 is coupled to cross-coupled inverters 380, 385 as shown. The inverter 380 outputs a logic "1" to the NAND gate 215, thus masking the value on the DQ line 120 from the compression circuit 125. It is contemplated that the input circuit 300 may be implemented without the enable/disable feature. In the following discussion of the operation of the latch 305, it is assumed that the enable signal is asserted.

If the LATCH signal is deasserted (i.e., flow through mode), the NAND gate 325 outputs a logic "1" regardless of the value of the CLK signal. Accordingly, the first multiplexer 310 is always enabled. Also, the AND gate 345 outputs a logic "0," causing the NOR gate 350 to output a logic "1" and enable the second multiplexer 315. The first multiplexer 310 and the second multiplexer 315 remain enabled while the LATCH signal is deasserted, thus passing the value on the DQ line 120 through to the NAND gate 215.

If the LATCH signal is asserted (i.e., latching mode), the CLK signal controls the latch 305. The NAND gate 325 outputs a logic "1" when the CLK signal is at a logically low state. Accordingly, the first multiplexer 310 is enabled and the value on the DQ line 120 passes through the first multiplexer 310 to the inverter 320. When the CLK signal transitions to a logically high state, the NAND gate 325 outputs a logic "0" and disables the first multiplexer 310. The cross-coupled inverters 320, 325 maintain the value present on the DQ line 120 prior to the CLK transition. The AND gate 345 outputs a logic "0," causing the NOR gate 350 to output a logic "1" and enable the second multiplexer 315. The value being maintained by the inverters 320, 325 is thus passed through to the inverter 380, inverted by the inverter 380, and provided to the NAND gate 215. When the CLK signal transitions back to a logically low state, the second multiplexer 315 is disabled and the first multiplexer 310 is enabled. The cross-coupled inverters 380, 385 maintain the value present at the output of the second multiplexer 315 prior to the CLK transition.

The input circuit 302 of FIG. 5B operates in a similar manner as described above in reference to FIG. 5A. However, the input circuit of FIG. 5B includes a p-channel transistor 390 coupled between the second multiplexer 315 and a voltage source 395. The gate of the transistor 390 is coupled to the enable line 360. Accordingly, when the enable signal is deasserted, the second multiplexer 315 is disabled, the transistor 390 is enabled, and the output of the second multiplexer 315 is tied to a logically high state. The cross-coupled inverters 380, 385 invert the logically high value and provide a logic "0" to the NOR gate 240, thus masking the data present on the DQ line 120.

Figure 6:
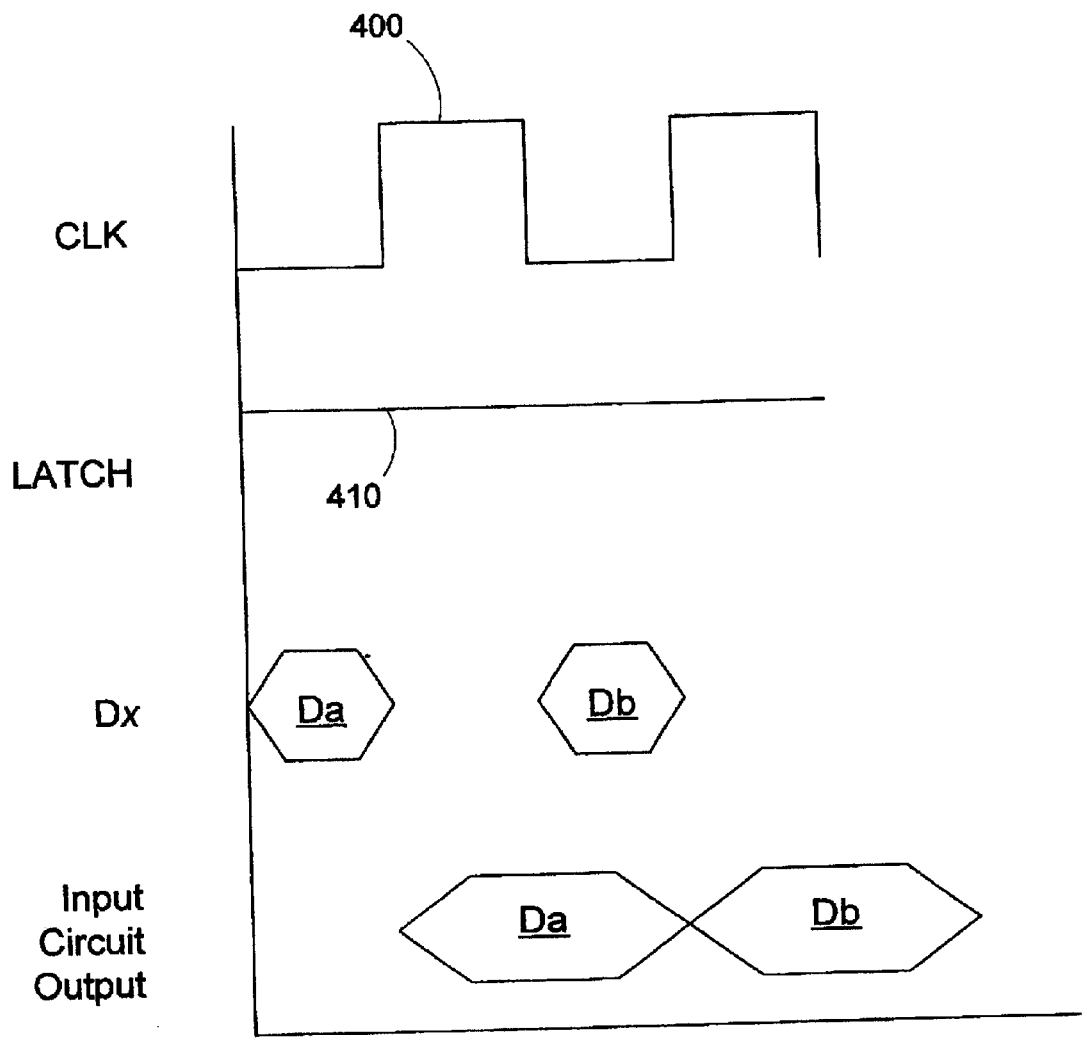
FIG. 6 is a timing diagram illustrating the operation of a latch used in the input circuit of FIG. 5.

The operation of the input circuit 300 in the latching mode is described in reference to FIG. 6. The combination of the CLK signal 400 and the LATCH signal 410 control the latch 305 as described above. The data input signals Da and Db present on the DQ line 120 are latched and provided as the output of the input circuit 212, 214 in the timing shown.

Figure 7:
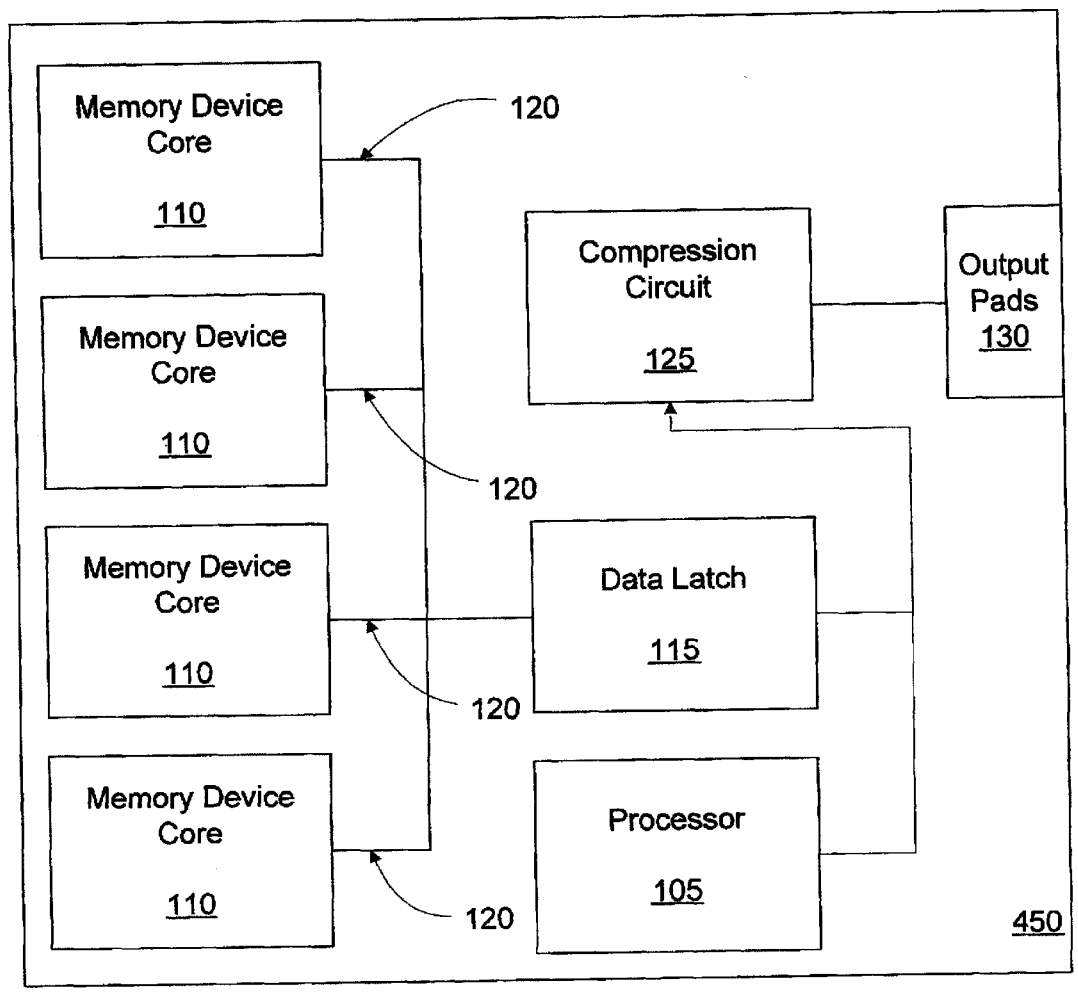
FIG. 7 is a block diagram of an alternative embodiment of an embedded device in accordance with the present invention.

FIG. 7 illustrates an alternative embodiment of an embedded device 450. In this embodiment, the compression circuit 125 is coupled to the output of the data latch 115. Coupling the compression circuit 125 in this manner accomplishes the latching function of the latch 305 in the input circuits 300,302 of FIGS. 5A and 5B without requiring additional logic for the latch 305. The compression circuit 125 of FIG. 7 may include the enabling function for masking individual DQ lines 120 as described above in reference to FIG. 4.

Figure 8:
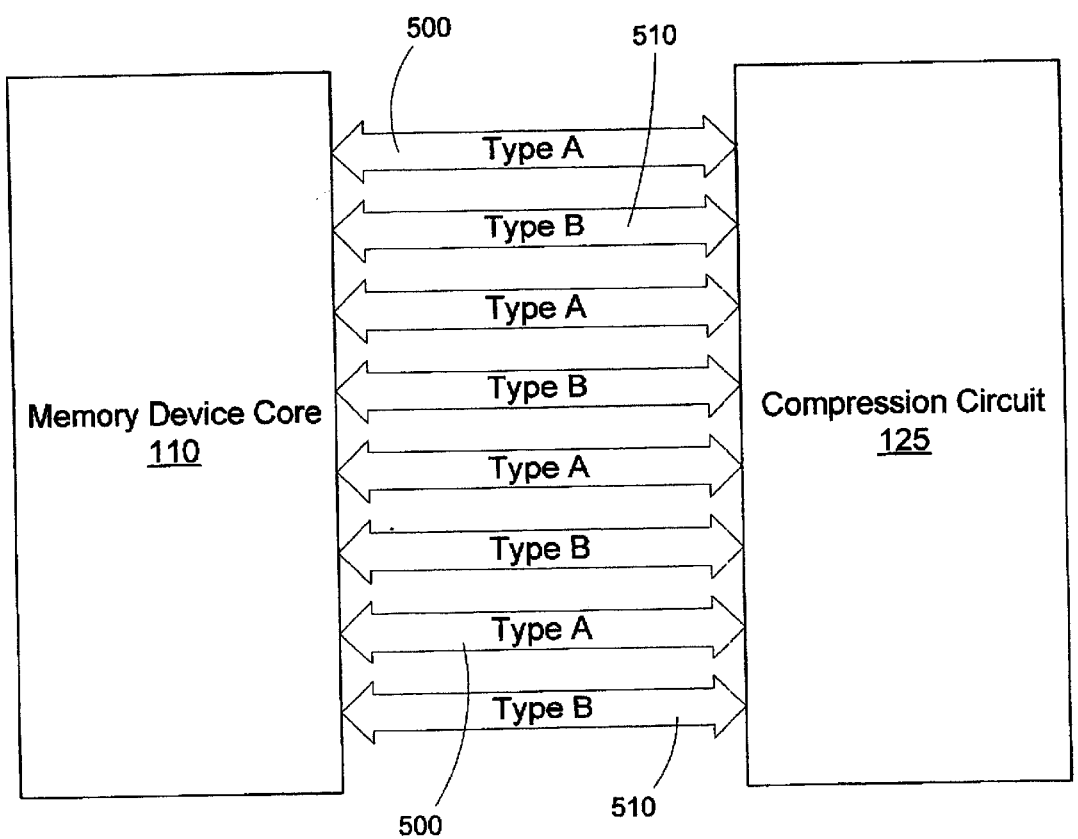
FIG. 8 is a block diagram of the connections between a memory array and the compression circuit of FIGS. 3 and 7.

FIG. 8 illustrates the coupling arrangement between the DQ lines 120 of one of the memory device cores 110 and the compression circuit 125. To prevent electrical shorts and capacitive coupling to disguise faults within the memory device core 110, DQ lines 500 of a first topology type (e.g., Type A) are interleaved with DQ lines 510 of a second topology type (e.g., Type B). It is unlikely that two Type A DQ lines 500 could short together without also shorting to a Type B DQ line 510. The short between the Type A DQ line 500 and the Type B DQ line 510 can be detected by the compression circuit 125. Also, because the Type A DQ lines 500 have a different topology than the Type B DQ lines 510, they will not be concurrently transitioning to the same logic level, and as such, a capacitive coupling error is unlikely.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An apparatus for testing a memory device having a plurality of data lines, comprising:

an input circuit including a plurality of latches adapted to receive at least a first subset of the data lines and a plurality of enable signals, each enable signal being associated with at least one of the first subset of data lines;

a compression circuit coupled to the latches and being adapted to detect a predetermined pattern on the first subset of data lines; and an output circuit coupled to the compression circuit and adapted to provide at least a pass signal when the predetermined pattern is detected on the first subset of data lines, wherein the input circuit is capable of masking at least one of the first subset of data lines from the compression circuit based on the associated enable signal.

2. The apparatus of claim 1, wherein the input circuit comprises:

a multiplexer having an input coupled to a first data line of the first subset of data lines, a first control input coupled to receive a first enable signal associated with the first data line, and an output;

a transistor coupled between the output of the multiplexer and a voltage source and having a base input coupled to receive the first enable signal.

3. The apparatus of claim 2, wherein the voltage source is a positive voltage source.

4. The apparatus of claim 3, wherein the multiplexer includes a second control input, and the input circuit further includes an inverter coupled to the first enable signal and the second control input.

5. The apparatus of claim 3 wherein the compression circuit is adapted to perform a NAND Boolean function.

6. The apparatus of claim 2, wherein the voltage source is ground and the input circuit further includes an inverter coupled between the first enable signal and the transistor.

7. The apparatus of claim 6, wherein the multiplexer includes a second control input and the inverter is coupled to the second control input.

8. The apparatus of claim 6 wherein the compression circuit is adapted to perform a NOR Boolean function.

9. The apparatus of claim 1, wherein the plurality of data lines include a second subset of data lines having a first data topology and a third subset of data lines having a second data topology, and the second subset of data lines is physically interleaved with the third subset of data lines.

10. The apparatus of claim 1, wherein the input circuit includes a first logic gate adapted to receive a latch signal and a clock signal and to enable the latches based on a first combination of the latch signal and the clock signal.

11. The apparatus of claim 10, wherein the input circuit includes a first multiplexer having a first multiplexer input coupled to a first data line of the first subset of data lines, a first control input coupled to the first logic gate, and a first multiplexer output.

12. The apparatus of claim 11, wherein the input circuit further comprises:

a first inverter having a first inverter input coupled to the first multiplexer output, and a first inverter output; and a second inverter having a second inverter input coupled to the first inverter output and a second inverter output coupled to the first inverter input.

13. The apparatus of claim 12, wherein the input circuit further comprises a second multiplexer having a second multiplexer input coupled to the first inverter output, and a second multiplexer output.

14. The apparatus of claim 13, wherein the input circuit includes at least a second logic gate adapted to receive the latch signal and the clock signal and to enable the second multiplexer based on a second combination of the latch signal and the clock signal.

15. The apparatus of claim 13, wherein the input circuit further comprises:

a third inverter having a third inverter input coupled to the second multiplexer output, and a third inverter output; and a fourth inverter having a fourth inverter input coupled to the third inverter output and a fourth inverter output coupled to the third inverter input.

16. The apparatus of claim 15, wherein the third inverter output is coupled to the compression circuit.

17. The apparatus of claim 1, wherein the input circuit includes a latch output and a transistor coupled between the latch output and a voltage source and having a gate coupled to receive the associated enable signal.

18. The apparatus of claim 17, wherein the voltage source is a positive voltage source.

19. The apparatus of claim 17, wherein the voltage source is ground.

20. The apparatus of claim 1, wherein the compression circuit is adapted to perform a NAND Boolean function.

21. The apparatus of claim 1, wherein the compression circuit is adapted to perform a NOR Boolean function.

22. An electronic device, comprising:

a memory core having a plurality of data lines;

a data latch coupled to the memory core and adapted to receive at least a first subset of the plurality of data lines and provide a plurality of latched data lines; and a compression circuit coupled to the latch and adapted to receive at least a second subset of the latched data lines and detect a predetermined pattern present on the second subset of latched data lines, wherein the compression circuit includes an input circuit, the input circuit being adapted to receive the second subset of latched data lines and a plurality of enable signals, each enable signal being associated with one of the second subset of latched data lines, wherein the input circuit is capable of masking at least one of the second subset of latched data lines from the compression circuit based on the associated enable signal.

23. The electronic device of claim 22, further comprising at least one output pad coupled to the compression circuit.

24. The electronic device of claim 22, wherein the plurality of data lines include a third subset of data lines having a first data topology and a fourth subset of data lines having a second data topology, and the second subset of data lines is physically interleaved with the third subset of data lines.

* * * * *